United States Patent
Perregaux et al.

(10) Patent No.: US 6,955,989 B2
(45) Date of Patent: Oct. 18, 2005

(54) USE OF A U-GROOVE AS AN ALTERNATIVE TO USING A V-GROOVE FOR PROTECTION AGAINST DICING INDUCED DAMAGE IN SILICON

(75) Inventors: Alain E. Perregaux, Rochester, NY (US); Paul A. Hosier, Rochester, NY (US); Josef E. Jedlicka, Rochester, NY (US); Nicholas J. Salatino, Penfield, NY (US); Jagdish C. Tandon, Fairport, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/996,681

(22) Filed: Nov. 30, 2001

(65) Prior Publication Data

US 2003/0194864 A1 Oct. 16, 2003

(51) Int. Cl.[7] ............................................. H01L 21/302
(52) U.S. Cl. ...................... 438/706; 438/460; 438/700; 438/710; 216/17
(58) Field of Search ................... 438/458, 460, 438/462, 700, 706, 710, 712, 720, 113, 444; 216/17, 58, 52

(56) References Cited

U.S. PATENT DOCUMENTS

| | | | | |
|---|---|---|---|---|
| 4,726,879 A | * | 2/1988 | Bondur et al. | 438/712 |
| 4,814,296 A | | 3/1989 | Jedlicka et al. | 437/226 |
| 5,691,248 A | * | 11/1997 | Cronin et al. | 438/109 |
| 5,998,238 A | * | 12/1999 | Kosaki | 438/114 |
| 6,117,347 A | * | 9/2000 | Ishida | 216/52 |
| 6,184,570 B1 | * | 2/2001 | MacDonald et al. | 257/622 |
| 6,363,201 B2 | * | 3/2002 | Sherrer et al. | 385/137 |
| 6,515,309 B1 | * | 2/2003 | Tohyama et al. | 257/88 |

* cited by examiner

*Primary Examiner*—Lan Vinh
(74) *Attorney, Agent, or Firm*—Christopher D. Wait

(57) ABSTRACT

The present disclosure relates that by modifying chip die dicing methodology to a U-groove profile from a V-groove profile by modifying the second etch step to be a dry etch instead of a wet etch results in a direct cost savings by eliminating a more expensive process step, as well as the need for stripping the developed photoresist layer. Furthermore, going to a U-groove profile accomplishes additional indirect and greater cost savings resulting from increased process throughput, improved yield, and reduced metal layer defects.

17 Claims, 2 Drawing Sheets

USE OF A U-GROOVE AS AN ALTERNATIVE TO USING A V-GROOVE FOR PROTECTION AGAINST DICING INDUCED DAMAGE IN SILICON

BACKGROUND OF THE INVENTION AND MATERIAL DISCLOSURE STATEMENT

The present invention relates generally to the fabrication of semiconductor devices. In particular, to the dicing of integrated circuit chips with great accuracy, and within close proximity to fabricated elements on the chip. The invention relates, most particularly, to the dicing of silicon sensor chips as employed for digital image sensors.

Image sensor dies for scanning document images, such as Charge Coupled Devices (CCDs), typically have a row or linear array of photo-sites together with suitable supporting circuitry integrated onto silicon. Usually, a die of this type is used to scan line by line across the width of a document with the document being moved or stepped lengthwise in synchronism therewith.

In the above application, the image resolution is proportional to the ratio of the scan width and the number of array photo-sites. Because of the difficulty in economically designing and fabricating long dies, image resolution for the typical die commercially available today is relatively low when the die is used to scan a full line. While resolution may be improved electronically as by interpolating extra image signals, or by interlacing several smaller dies with one another in a non-collinear fashion so as to crossover from one die to the next as scanning along the line progresses, electronic manipulations of this type adds to both the complexity and the cost of the system. Further, single or multiple die combinations such as described above usually require more complex and expensive optical systems.

However, a long or full width array, having a length equal to or larger than the document line and with a large packing of co-linear photo-sites to assure high resolution, has been and remains a very desirable arrangement. In the pursuit of a long or full width array, forming the array by assembling several small dies together end to end has become an exemplary arrangement. However, this necessitates providing dies whose photo-sites extend to the border or edge of the die, so as to assure continuity when the die is assembled end to end with other dies, and at the same time provide edges that are sufficiently smooth and straight to be assembled together without loss of image data.

Although the standard technique of scribing and cleaving silicon wafers used by the semiconductor industry for many years produces dies having reasonably controlled dimensions, the microscopic damage occurring to the die surface during the scribing operation has effectively precluded the disposition of the photo-sites at the die edge. This is because the top surface of silicon wafers is virtually always parallel to the <100> plane of the crystalline lattice so that, when a wafer of this type is cut or diced with a high speed diamond blade, chips and slivers are broken away from the top surface of the wafer in the direct vicinity of the channel created by the blade. This surface chipping typically extends to about 50 microns, thus, rendering it impossible for active elements to be located any closer than about 50 microns from the dicing channel. This as a result, has driven the adoption of V-shaped grooves as a technique for providing much smoother dicing and thereby enabled tighter dicing accuracy and closer proximity of active chip elements to the chip/die edge.

U.S. Pat. No. 4,814,296 discloses a process for forming individual dies having faces that allow the dies to be assembled against other like dies to form one and/or two dimensional scanning arrays wherein the active side of a wafer is etched to form small V-shaped grooves defining the die faces, relatively wide grooves are cut in the inactive side of the wafer opposite each V-shaped groove, and the wafer cut by sawing along the V-shaped grooves, the saw being located so that the side of the saw blade facing the die is aligned with the bottom of the V-shaped groove so that there is retained intact one side of the V-shaped groove to intercept and prevent cracks and chipping caused by sawing from damaging the die active surface and any circuits thereon. U.S. Pat. No. 4,814,296 is hereby incorporated by reference in its entirety for its teaching.

However, utilization of a V-shaped groove technique while effective has proven to be expensive. This expense may be broadly characterized as due primarily to two things. Both of these arise from the requirement for an anisotropic etch so as to maintain a V-groove wall which is parallel to the <111> crystalline plane found in the wafer. First, there are the extra foundry costs. An anisotropic etch is a wet etch and as such is a non-standard process for most silicon foundries. This also means that the wafers must be stripped of their photoresist and require extra handling with placement in an off-line wet etch tool as well. Secondly, there is the cost impact resulting from chip yield effects. Anisotropic etching is by nature an aggressive etch due to the chemicals employed and, thus, often attacks and damages the top layers of passivation oxide and metal on the wafer. This is further exacerbated by the stripping of the photoresist, which would otherwise act as a barrier layer and aid in preventing wafer damage.

Therefore, as discussed above, there exists a need for an arrangement and methodology which will solve the problem of preventing cracks and chipping caused by damage from sawing while minimizing the costs of doing so. Thus, it would be desirable to solve this and other deficiencies and disadvantages as discussed above with an improved semiconductor dicing methodology.

The present invention relates to a method for dicing die from a semiconductor wafer while allowing a very close cut of a die edge relative to active elements on the die without damaging the active elements. The method steps comprise etching a U-groove via a dry etch in the semiconductor wafer and sawing the semiconductor wafer along the U-groove where one edge of the saw is substantially in alignment with the bottom of the U-groove.

In particular, the present invention relates to a method for dicing die from a semiconductor wafer while allowing a very close cut of a die edge relative to active elements on the die without damaging the active elements. The method steps comprising etching by way of a first dry etch an opening down to the surface of the semiconductor wafer, followed by etching by way of a second dry etch a U-groove in the opening down to the surface of the semiconductor wafer created by the first dry etch, and then sawing the semiconductor wafer along the U-groove where one edge of the saw is substantially in alignment with the bottom of the U-groove.

The present invention also relates to a method of fabricating high resolution image sensor dies from a wafer so that the dies have precision faces to enable the dies to be assembled with other like dies to form a larger array without image loss or distortion at the points where the dies are assembled together. The method comprising the steps of etching small U-shaped grooves in one side of a wafer delineating the faces of the dies where the dies are to be separated from the wafer. This is followed by forming grooves in the opposite side of the wafer opposite each of the U-shaped grooves, the axis of the grooves being parallel to the axis of the U-shaped groove opposite thereto. In turn this is followed by, sawing the wafer along the U-shaped grooves with one side of the cut made by sawing being substantially coextensive with the bottom of the U-shaped grooves whereby one side of the U-shaped grooves is at least partially obliterated by the sawing, the sides of the U-shaped grooves that remain serving to prevent development of fractures in the die beyond the remaining side as the wafer is being sawed.

DESCRIPTION OF THE INVENTION

The prior approach employed of using a V-groove for dicing image sensor dies as described above has associated with it increased costs, process cycle time, reduced yield and increased metal layer defects. The disclosure taught herein overcomes these disadvantages by replacing the V-groove with a U-groove, using in one embodiment a dry etch consisting of $SF_6$, He and $O_2$. The intent of etching a V-groove into the silicon is to relieve damage to the device caused by dicing the wafer. A U-groove has proven itself as an improvement because the angle of the U-groove is sufficient to deflect cracking and stress away from the device while only requiring a dry etch for its achievement.

Figure 1:
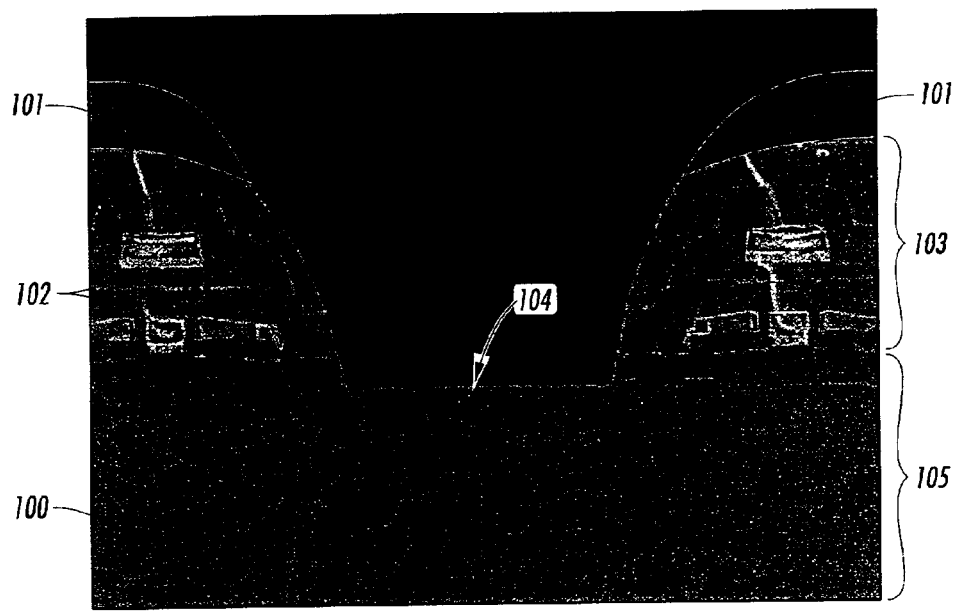
FIG. 1 depicts a cross section of the wafer at the dicing channel and at that process step where a groove is to be cut prior to the wet etch.

FIG. 1 depicts a cross section of a wafer 100 comprising dies to be diced. The cross section depicted is a SEM magnification of one dicing channel on wafer 100. Here in FIG. 1 is depicted the result after photoresist 101 has been applied, exposed, and developed, and with a subsequent first dry etch performed to etch through any metal layers 102 as well as any TEOS 103 (Tetraethylorthosilicate) layers to reach the silicon surface 104 of the silicon layer 105. This opens oxide opening 104 to about 6 microns in width in one preferred embodiment. The photoresist 101, at initially 22000 angstroms, is attacked by the first dry etch at a rate of about 52 angstroms per second, leaving approximately 5000 angstroms behind.

Figure 2:
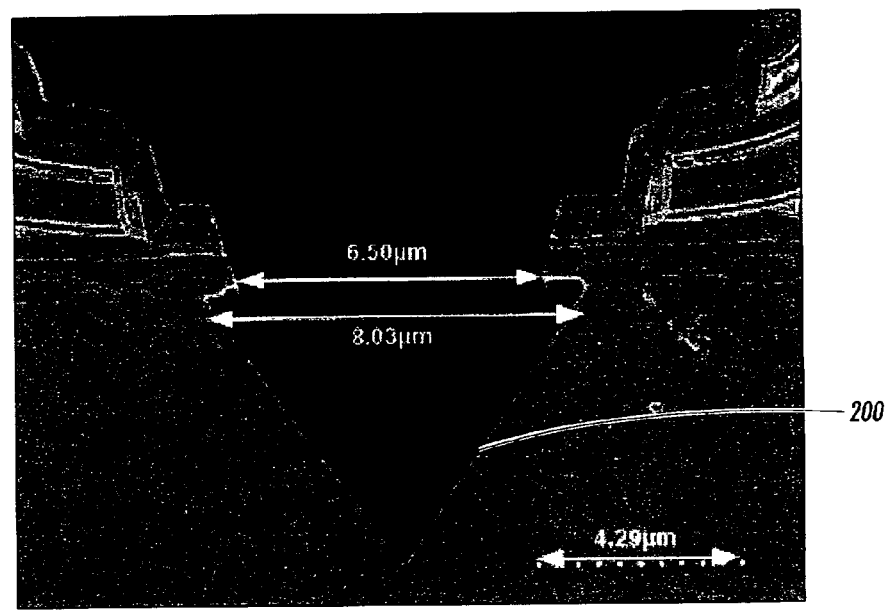
FIG. 2 depicts the result after formation of a V-groove.

In FIG. 2 there is depicted the result for a prior art V-groove process. The photoresist of FIG. 1 has been stripped away and the wafer transferred to a wet etch tool for a Tetra methyl Ammonium Hydroxide (TMAH) wet etch of 330 seconds. This TMAH etch has been favored for its anisotropic etching effect, however it also attacks the final-level metal through cracks in the TEOS passivation layers impacting chip yield. In one typical embodiment, the V-groove 200 that results for an approximate 6 micron opening will have an approximate depth of 4 microns and a total width with undercut of about 7.5 microns as typified in the depiction provided in FIG. 2.

Figure 3:
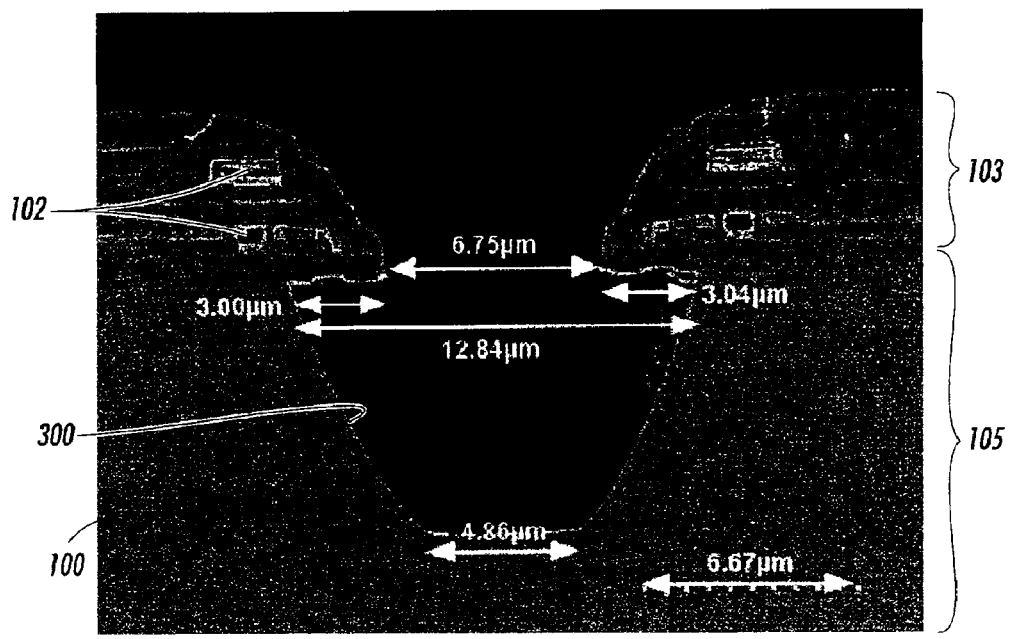
FIG. 3 depicts the result after formation of a U-groove.

The U-groove 300 is depicted in FIG. 3. The U-groove process begins the same as the V-groove process. However, it departs in its process steps subsequent to the stage depicted in FIG. 1. Unlike with the V-groove process, whatever remains of the photoresist 101 is not stripped. The photoresist 101 is left in place thereby eliminating the stripping step and by virtue of retaining the photoresist 101 it also further provides protection for the underlying metal and TEOS layers in the following steps.

The next step in the methodology is to employ a second dry etch consisting of SF6 and O2, and thereby create the U-groove 300 in silicon layer 105 as shown in FIG. 3. The original intent of etching a V-Groove 200 into the silicon 105 is to relieve damage to the die caused by dicing the wafer. A U-Groove 300 is an acceptable alternative because the angle of the groove is sufficient to deflect cracking and stress away from any devices on the wafer 100. Replacing the V-Groove 200 with a U-Groove 300 results in cost savings, increased process throughput, improved yield and reduced metal-3 defects, all by virtue of eliminating the wet TMAH etch.

Table (1) shows parameter range median start points developed for one U-Groove 300 embodiment. It will be well understood by those skilled in the art that these parameters will vary from tool to tool, and that it is not useful to provide greater specifics. It will also be understood that these parameters may be varied even upon the same tool, yet still achieve the same results. Nevertheless, etching silicon is well understood in the art, and those so skilled will be able with the table to practice the invention without undue experimentation. The reported etch time in the table of about 75 seconds was needed for a 4 micron deep U-Groove 300, which is also the approximate depth of the V-Groove 200 in one preferred embodiment.

TABLE 1

U-Groove Etch Parameters for a Dry Etch Tool

| Parameter | Median Start Points |
|---|---|
| Pressure | Approximately 300 mTorr |
| RF | Approximately 200 Watts |
| $O_2$ Flow | Approximately 15 sccm |
| He Flow | Approximately 65 sccm |
| $SF_6$ Flow | Approximately 175 sccm |
| Etch Time | Approximately 75 seconds |

Figure 4:
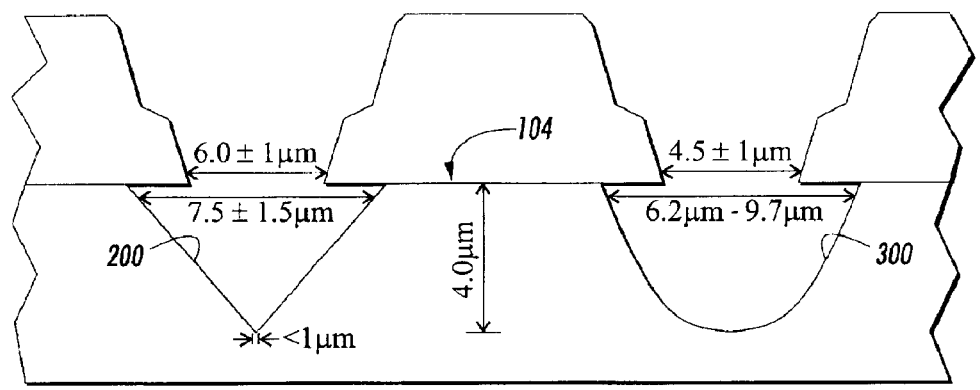
FIG. 4 depicts the schematical representation of both a V-groove and an U-groove for purposes of geometric comparison.

A schematic profile of a V-Groove and U-Groove is shown in FIG. 4 for comparison and to clarify the target dimensions. The desired U-Groove 300 dimensions were derived from the specifications and requirements set for V-Grooves and by the limitations in the U-Groove etch process. The minimum V-Groove 200 depth is 3.5 microns and 7.5 microns wide, with an oxide opening of 6.0 microns and flat bottom less than 1 microns. U-Groove 300 specifications will be targeted to 4.5±1 microns for both the oxide opening and depth, with a U-Groove 300 width between 6.2 microns and 9.7 microns. The desired variation in depth across the wafer is less than 15 percent. In achieving this, the U-Groove 300 oxide opening is best made significantly smaller than the corresponding V-Groove oxide opening to help reduce the overall U-Groove width. However, this is not a requirement to practice the invention. Substituting a new V-Groove mask is, therefore, used in one embodiment to achieve an oxide opening of 4.5 microns for the U-Groove process.

The subsequent steps for dicing the wafer into die are as is well known by those skilled in the art, and also as described in U.S. Pat. No. 4,814,296 previously incorporated above. A second groove is formed in the bottom or inactive surface of the wafer 100 opposite and parallel to each U-groove 300. The wafers are then typically secured and cut using a suitable cutting device such as a high speed diamond dicing blade.

In closing, by going to a U-groove profile and modifying the second etch to be a dry etch instead of a wet etch results in a direct cost savings by eliminating a more expensive process step, as well as the need for stripping the developed photoresist layer. Furthermore, going to a U-groove profile accomplishes additional indirect and perhaps greater cost savings from the increased process throughput, improved yield, and reduced metal layer defects.

While the embodiments disclosed herein are preferred, it will be appreciated from this teaching that various alternative, modifications, variations or improvements therein may be made by those skilled in the art. For example, it will be understood by those skilled in the art that the teachings provided herein may be applicable to other semiconductor types, including: gallium arsenide, and particularly to silicon on insulator, and amorphous silicon. There are also many other tool sets known to those skilled in the art with which to effectively provide a suitable dry etch as well as other combinations of etch rate, pressure, RF energy, gas rate, and etch time beyond those disclosed. All such variants of processing technique are intended to be encompassed by the following claims.

What is claimed is:

1. A method for dicing die from a semiconductor wafer while allowing a very close cut of a die edge relative to active elements on the die without damaging the active elements comprising:

etching by way of a first dry etch an opening down to the surface of the semiconductor wafer;

etching by way of a second dry etch a U-groove in the opening down to the surface of the semiconductor wafer created by the first dry etch; and sawing the semiconductor wafer along the U-groove where one edge of the saw is substantially in alignment with the bottom of the U-groove.

2. The method of claim 1 wherein the first dry etch comprises SF6 as the main active gas component.

3. The method of claim 1 wherein the second dry etch uses a combination of gases comprising SF6 and O2.

4. The method of claim 1 wherein the opening at the surface is 3.5 to 5.5 microns wide.

5. The method of claim 1 wherein the U-groove is approximately 4 microns in depth.

6. The method of claim 1 wherein the U-groove is approximately 3.5 to 5.5 microns in depth.

7. The method of claim 1 wherein the U-groove is approximately 6 to 10 microns in width.

8. The method of claim 1 wherein the semiconductor wafer is comprised of amorphous silicon.

9. The method of claim 1 wherein the semiconductor wafer is comprised of a III–V compound.

10. The method of claim 1 wherein the semiconductor wafer is comprised of gallium arsenide.

11. The method of claim 1 wherein the semiconductor wafer is comprised of silicon on insulator.

12. A method of fabricating high resolution image sensor dies from a wafer so that the dies have precision faces to enable the dies to be assembled with other like dies to form a larger array without image loss or distortion at the points where the dies are assembled together, comprising the steps of:

etching by way of a first dry etch an opening down to the surface of the semiconductor wafer;

etching by way of a second dry etch small U-shaped grooves in the opening down to the surface of the semiconductor wafer created by the first dry etch;

forming grooves in the opposite side of the wafer opposite each of the U-shaped grooves, the axis of the grooves being parallel to the axis of the U-shaped groove opposite thereto; and sawing the wafer along the U-shaped grooves with one side of the cut made by sawing being substantially coextensive with the bottom of the U-shaped grooves whereby one side of the U-shaped grooves is at least partially obliterated by the sawing, the sides of the U-shaped grooves that remain serving to prevent development of fractures in the die beyond the remaining side as the wafer is being sawed.

13. The method of claim 12 wherein the etching is a dry etch using a combination of gases comprising SF6 and O2.

14. The method of claim 13 wherein the opening at the surface is 3.5 to 5.5 microns wide.

15. The method of claim 13 wherein the U-groove is approximately 4 microns in depth.

16. The method of claim 13 wherein the U-groove is approximately 3.5 to 5.5 microns in depth.

17. The method of claim 13 wherein the U-groove is approximately 6 to 10 microns in width.

* * * * *